(12) United States Patent
Greenberg et al.

(10) Patent No.: US 7,852,098 B2
(45) Date of Patent: Dec. 14, 2010

(54) ON-DIE HEATING CIRCUIT AND CONTROL LOOP FOR RAPID HEATING OF THE DIE

(75) Inventors: Jody Greenberg, Sunnyvale, CA (US); Sehat Sutardja, Los Altos Hills, CA (US)

(73) Assignee: Marvell World Trade Ltd. (BB)

( * ) Notice: Subject to any disclaimer, the term of this patent is extended or adjusted under 35 U.S.C. 154(b) by 24 days.

(21) Appl. No.: 11/243,017

(22) Filed: Oct. 3, 2005

(65) Prior Publication Data

US 2007/0024292 A1 Feb. 1, 2007

Related U.S. Application Data

(60) Provisional application No. 60/722,226, filed on Sep. 30, 2005, provisional application No. 60/704,399, filed on Aug. 1, 2005.

(51) Int. Cl.
G01R 31/02 (2006.01)
G01R 27/08 (2006.01)
G01R 31/26 (2006.01)

(52) U.S. Cl. .................. 324/760; 324/721; 324/765

(58) Field of Classification Search .......... 324/760, 324/721, 765
See application file for complete search history.

(56) References Cited

U.S. PATENT DOCUMENTS

| 3,383,614 | A |   | 5/1968  | Emmons |
|-----------|---|---|---------|--------|
| 4,228,713 | A |   | 10/1980 | Gross |
| 4,497,998 | A |   | 2/1985  | West |
| 4,893,097 | A |   | 1/1990  | Zwack |
| 4,952,865 | A |   | 8/1990  | Pataut et al. |
| 5,053,723 | A |   | 10/1991 | Schemmel |
| 5,081,431 | A |   | 1/1992  | Kubo et al. |
| 5,233,161 | A |   | 8/1993  | Farwell et al. |
| 5,309,090 | A |   | 5/1994  | Lipp |
| 5,463,252 | A | * | 10/1995 | Jones et al. .................. 257/723 |
| 5,574,408 | A |   | 11/1996 | Zwack |
| 5,659,270 | A |   | 8/1997  | Millen et al. |
| 5,793,022 | A | * | 8/1998  | Klinck et al. ............... 219/483 |
| 5,809,336 | A |   | 9/1998  | Moore et al. |
| 5,982,189 | A |   | 11/1999 | Motika et al. |
| 6,160,458 | A |   | 12/2000 | Cole et al. |
| 6,598,148 | B1 |  | 7/2003  | Moore et al. |
| 6,803,829 | B2 |  | 10/2004 | Duncan et al. |
| 6,815,965 | B1 |  | 11/2004 | Eppes et al. |

(Continued)

FOREIGN PATENT DOCUMENTS

DE 197 27 972 A1 1/1998

(Continued)

OTHER PUBLICATIONS

EP Communication pursuant to Article 96.2 E.P.C. EP030174477.5.

(Continued)

Primary Examiner—Amy He (57) ABSTRACT

An integrated circuit includes a heating circuit configured to heat the integrated circuit under the control of a controller. A transfer function with adjustable pole, zero and overall gain is implemented in the controller such that a temperature response of the integrated circuit can be changed by adjusting one or more of the adjustable pole, zero and overall gain.

25 Claims, 8 Drawing Sheets

U.S. PATENT DOCUMENTS

| | | |
|---|---|---|
| 6,850,125 B2 | 2/2005 | Norman et al. |
| 7,030,581 B1 * | 4/2006 | Ikeda .................. 318/432 |
| 2003/0206730 A1 | 11/2003 | Golan |
| 2004/0071029 A1 | 4/2004 | Sutardja |
| 2004/0181961 A1 | 9/2004 | Hwang et al. |
| 2004/0204899 A1 | 10/2004 | Gunther et al. |
| 2005/0001596 A1 | 1/2005 | Lovett |
| 2005/0029250 A1 * | 2/2005 | Niwa et al. ................ 219/494 |
| 2005/0040810 A1 | 2/2005 | Poirier et al. |
| 2005/0043909 A1 | 2/2005 | Poirier et al. |
| 2005/0265136 A1 | 12/2005 | Wu |

FOREIGN PATENT DOCUMENTS

| | | |
|---|---|---|
| EP | 0766376 A1 | 4/1997 |
| EP | 1143606 A1 | 10/2001 |
| EP | 1 411 630 A | 4/2004 |
| EP | 1411630 A1 * | 4/2004 |
| JP | 01114067 | 5/1989 |
| JP | 06088854 | 3/1994 |
| JP | 10154665 | 6/1997 |
| JP | 2000277686 | 10/2000 |
| JP | 2001007297 | 1/2001 |
| JP | 2005 062090 | 3/2005 |

OTHER PUBLICATIONS

U.S. Appl. No. 10/892,709 "Integrated Circuit Including Processor and Crystal Oscillator Emulator".

U.S. Appl. No. 10/272,247 entitled "Crystal Oscillator Emulator", filed Oct. 15, 2002.

International Search Report for WO 2007/016601, Feb. 8, 2007.

Austrian Patent Search Report for Singapore Patent Application 200604605-6, Jul. 13, 2007.

Extended European Search Report for EP 06015255.0, May 30, 2008.

Office Action from corresponding Japanese Patent Application No. 2006-205994, dated Jun. 25, 2010.

\* cited by examiner

ON-DIE HEATING CIRCUIT AND CONTROL LOOP FOR RAPID HEATING OF THE DIE

CROSS-REFERENCES TO RELATED APPLICATIONS

This application claims the benefit of U.S. provisional application No. 60/704,399 filed Aug. 1, 2005, and U.S. provisional application No. 60/722,226 filed Sep. 30, 2005, incorporated herein by reference. Additionally, this application is related to the commonly assigned co-pending patent application Ser. No. 11/242,230 filed Oct. 3, 2005, titled "Low-Noise Fine-Frequency Tuning," incorporated herein by reference.

BACKGROUND OF THE INVENTION

The invention relates to semiconductor integrated circuits (ICs) and more particularly to an on-die heating circuit and control loop for rapid calibration and testing.

Conventional methods of heating ICs for testing or calibration purposes include externally applying heat to the IC or placing the IC in a special temperature controlled chamber. These arrangements are generally costly to implement and do not provide accurate results where the IC needs to be rapidly heated to precise temperatures as in the case of calibration of temperature sensitive circuits.

Therefore, it would be advantageous to be able to control the temperature of an IC so that the IC can be rapidly and accurately heated to one or more temperatures without the need for placing the IC in special temperature chambers.

BRIEF SUMMARY OF THE INVENTION

Embodiments of the present invention provide circuits, methods, apparatus, and code that enable rapid internal heating of an integrated circuit to one or more target temperatures.

In accordance with an embodiment of the invention, an integrated circuit includes a controller means and heating means for heating the integrated circuit under the control of the controller means, wherein a transfer function with adjustable pole, zero and overall gain is implemented in the controller means such that a temperature response of the integrated circuit can be changed by adjusting one or more of the adjustable pole, zero and overall gain.

In one embodiment, the controller means receives a command from a source external to the integrated circuit for digitally adjusting one or more of the adjustable pole, zero and overall gain, wherein the command includes information corresponding to thermal properties of a package in which the integrated circuit is housed.

In another embodiment, the zero of the adjustable pole, zero and overall gain is adjusted so as to compensate for slow thermal dynamics of the package in which the integrated circuit is housed.

In yet another embodiment, the integrated circuit further includes a temperature measurement means for measuring a temperature of the integrated circuit, and detector means for detecting the difference between the measured temperature and a target temperature, and provide the detected difference in temperature to the controller means.

In yet another embodiment, the integrated circuit further includes a temperature sensitive block which includes one or more circuit elements, wherein the controller means is configured to cause the heating means to heat the integrated circuit to multiple temperatures, the temperature sensitive block being calibrated at each of the multiple temperatures.

In yet another embodiment, the integrated circuit further includes a temperature sensitive block which includes one or more circuit elements, wherein the temperature sensitive block and the temperature measurement means are located at a predetermined location on the integrated circuit where a temperature gradient generated across the integrated circuit as a result of the heat generated by the heating means is substantially at a minimum.

In yet another embodiment, the integrated circuit further includes a temperature sensitive circuit which includes one or more circuit elements, wherein the temperature sensitive block and the temperature measurement means are located along a first side of the integrated circuit and the heating means is located along another side of the integrated circuit opposite the first side In yet another embodiment, the heating means includes a bias means for generating a bias signal, and a power dissipating means for receiving the bias signal and a plurality of control signals from the controller means.

In yet another embodiment, the power dissipating means comprises an array of transistors configured such that depending on a target temperature a predetermined number of the transistors are turned on to conduct current.

In yet another embodiment, each transistor in the array of transistors has a gate to which the bias signal is selectively applied to turn on the transistor.

In yet another embodiment, in response to the control signals the bias signal is selectively applied to gates of the transistors in the array of the transistors to selectively turn on the transistors.

In yet another embodiment, the integrated circuit is powered by a supply voltage, and in response to variations in the supply voltage the bias means adjusts the bias signal such that the operation of the power dissipating means is substantially insensitive to variations of the supply voltage within a predetermined voltage range.

In yet another embodiment, the bias means further operates to adjust the bias signal such that the operation of the power dissipating means is substantially insensitive to temperature variations.

Still other embodiments of the invention may be implemented in code, for example, by a digital signal processor (DSP). On such embodiment includes code for adjusting one or more of adjustable pole, zero and overall gain of a transfer function implemented in a controller to thereby change a temperature response of the integrated circuit, and code for internally heating the integrated circuit in accordance with the adjusted one or more of adjustable pole, zero and overall gain.

In one embodiment, the code for adjusting one of more of adjustable pole, zero and overall gain comprises code for receiving a command from a source external to the integrated circuit for digitally adjusting the one or more of the adjustable pole, zero and overall gain, the command including information corresponding to thermal properties of a package in which the integrated circuit is housed.

In yet another embodiment, the code for automatically adjusting a adjustable pole, zero and overall gain includes code for adjusting the zero of the adjustable pole, zero and overall gain so as to compensate for slow thermal dynamics of the package in which the integrated circuit is housed.

In yet another embodiment, the invention further comprises code for internally measuring a temperature of the integrated circuit, and code for internally detecting a difference between the measured temperature and a target temperature.

In another embodiment, the integrated circuit includes a temperature sensitive block comprising one or more circuit elements, the invention further comprising code for heating the integrated circuit to multiple temperatures by repeating the codes for internally heating, internally measuring, and internally detecting, and code for internally calibrating the temperature sensitive block at each of the multiple temperatures.

In yet another embodiment, the temperature measuring resulting from execution of the code for internally measuring a temperature of the integrated circuit is carried out at a location on the integrated circuit where a temperature gradient across the integrated circuit resulting from execution of the code for heating the integrated circuit is substantially at a minimum.

In yet another embodiment, the temperature measuring resulting from execution of the code for internally measuring a temperature of the integrated circuit is carried out at a location along a first side of the integrated circuit and the heating of the integrated circuit resulting from execution of code for internally heating the integrated circuit is carried out at a location along another side of the integrated circuit opposite the first side.

In yet another embodiment, the invention comprises code for generating a bias signal for controlling the heating of the integrated circuit such that the heating of the integrated circuit is substantially insensitive to variations of a power supply voltage powering the integrated circuit.

In yet another embodiment, the invention comprises code for, depending on a target temperature, applying the bias signal to a predetermined number of transistors in an array of transistors to thereby turn on the predetermined number of transistors.

In yet another embodiment, the invention comprises code for selectively applying the bias signal to a gate of each transistor in the array of transistors to turn on the transistor.

In yet another embodiment, the invention comprises code for generating control signals, and code for selectively applying the control signals to gates of the transistors in the array of the transistors to selectively turn on the transistors.

A better understanding of the nature and advantages of the present invention may be gained with reference to the following detailed description and the accompanying drawings.

DETAILED DESCRIPTION OF THE INVENTION

In accordance with an embodiment of the present invention, an on-die heating circuit is used in a closed loop feedback configuration to rapidly heat the die to a digitally specified temperature. This can be used for test purposes (very stable temperature testing, with fine resolution) such as during characterization, production testing, or bench testing. It can also be used to calibrate any temperature sensitive circuitry or circuit element (e.g., reference circuit, oscillator, inductor, and the like) on the chip without requiring testing at multiple external temperatures. In addition to the die-heating circuit, the closed loop feedback configuration includes a temperature measurement circuit, an A/D converter, and a digital controller. The digital controller allows programmability of the loop dynamics to minimize the temperature response time and achieve a stable heating for any package/environment thermal characteristics.

Figure 1:
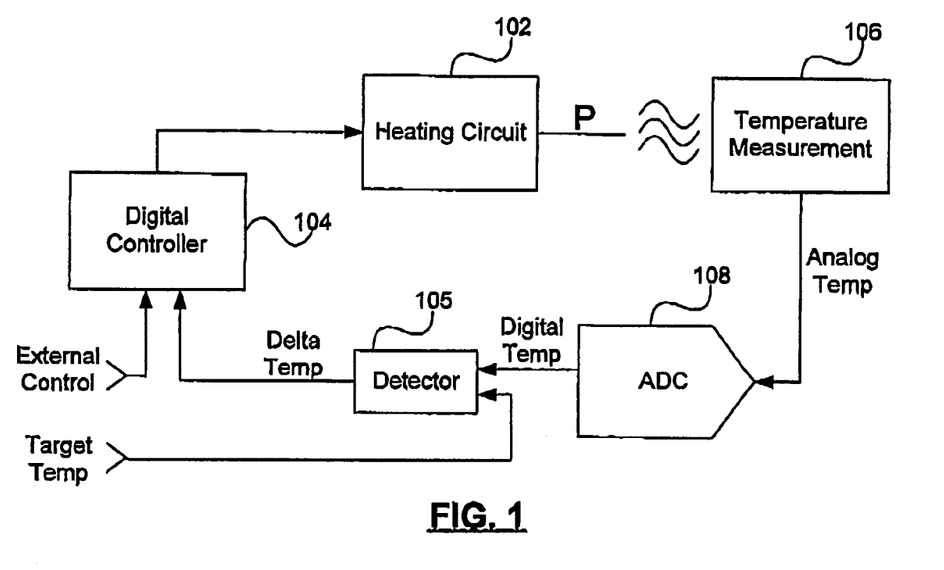
FIG. 1 is a block diagram of an on-die thermal management system in accordance with an embodiment of the invention.

FIG. 1 is a block diagram of an on-die thermal management system in accordance with an embodiment of the invention. A heating circuit 102 generates heat under the control of a digital controller 104. A temperature measurement block 106 measures and converts the temperature to analog signals. An A/D converter 108 coverts the analog temperature signals to digital signals and feeds them to a detector circuit 105. Detector circuit 105 detects the difference between the digital temperature and an externally provided target temperature, and supplies the result (Delta Temp) to digital controller 104. Depending on the value of Delta Temp and other parameters stored in digital controller 104, controller 104 causes heating circuit 102 to either maintain the IC temperature (as in when the target temperature has been reached) or generate more heat (as in when the target temperature has not yet been reached, or where heating to multiple temperatures is required, for example, for calibration purposes).

Figure 2:
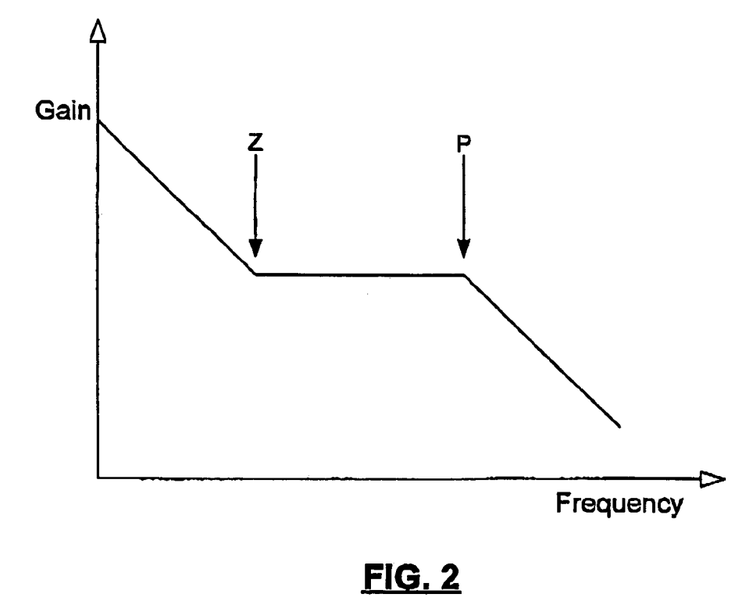
FIG. 2 shows a transfer function with adjustable features, in accordance with an embodiment of the invention.

Digital controller 104 implements an adjustable digital transfer function with a zero and a pole and an overall gain factor, all of which are digitally adjustable. The transfer function is shown in FIG. 2. One or more of the adjustable zero, pole and gain factor are adjusted based on the package thermal properties and dynamics to achieve rapid heating of the die to the target temperature(s). The adjustable zero, pole and gain are modified via external commands provided to the External Control terminal of controller 104. The external command includes information corresponding to the thermal properties of the particular package in which the IC is housed, as well as information regarding one or more target temperature(s) to which the IC is to be heated. In one embodiment, the External Control terminal is a serial I/O bus, and the command is provided to controller via the I/O bus under the control of a software program. In another embodiment, the adjustment of the digitally adjustable zero, pole and gain factor is performed during manufacturing of the IC by hard wiring the desired zero, pole and gain factor. This embodiment is advantageous where the type of package in which the IC is to be housed and its thermal properties are known prior to manufacturing thus allowing optimization of the digitally adjustable zero, pole and gain factor for the specific package.

The ability to rapidly reach the target temperature range is important in many applications including where efficient and rapid calibration of temperature sensitive circuits is required. Where an on-die heat source has been used in conventional circuits, rapid heating to the target temperature has been difficult to achieve because of the long time constants in the package. In accordance with an embodiment of the invention, a target temperature range is rapidly reached by compensating the slow thermal dynamics of the chip using the adjustable zero, pole and gain factor of the transfer function implemented in the controller. This is better illustrated in FIG. 3.

Figure 3:
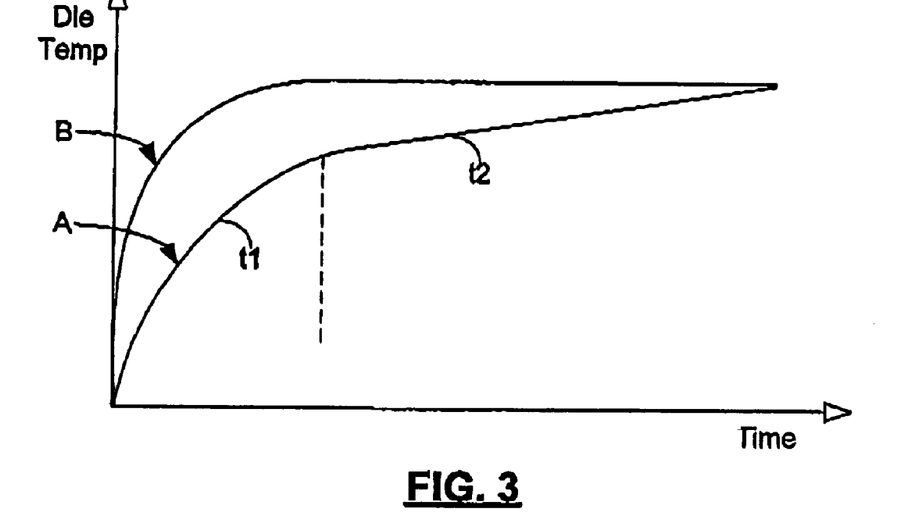
FIG. 3 shows a temperature response of a packaged IC on a PC board for two cases depicted by waveforms A and B.

FIG. 3 shows the temperature response of a packaged IC on a PC board for two cases depicted by waveforms A and B. Waveforms A and B show the temperature response to a step increase in power dissipated by the heating source for a conventional heating technique and for that of the present invention, respectively. Waveform A has two distinct time constants t1 and t2. An initial fairly quick response (time constant t1) reflects the rapid heating of the silicon die inside the package (the silicon mass is usually not very large and thus has a small heat capacity and low thermal resistance). As the silicon heats, a large temperature gradient is generated across the different material boundaries, namely, the silicon to package and the package to board boundaries. The package and the board are much larger masses and have higher thermal resistance than the silicon, hence the slow tail in the temperature response as depicted by the portion of waveform A marked as t2).

Figure 4:
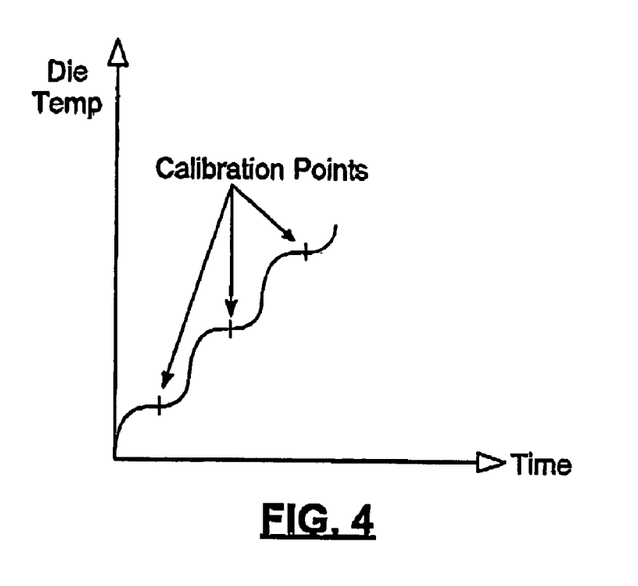
FIG. 4 illustrates one application of the present invention wherein the on-die heating circuit is used to rapidly heat the packaged IC to multiple temperatures for calibration purposes.

The transition point between the two time constants (marked in FIG. 3 by the vertical dash line) is similar to a closely placed pole-zero pair. Thus, to obtain a faster temperature response, the pole in the pole-zero pair needs to be canceled with a zero. This is achieved by adjusting the adjustable pole, zero, and gain factor of the controller. Waveform B shows the temperature response where the pole in the pole-zero pair is canceled by the zero of the transfer curve. The adjustable digital transfer function enables adjusting the amount and duration of power dissipated by the heating circuit to thereby achieve a fast temperature response for any environment that the die is placed in. In one application, the controller is designed so that the chip is digitally heated very quickly to multiple temperatures as illustrated in FIG. 4. This enables rapid calibration of temperature sensitive circuits and/or circuit elements on the die at each temperature point. Exemplary integrated circuits in which this technique is advantageously implemented for purposes of rapid and precise calibration are described in the above-referenced commonly assigned co-pending patent application Ser. No. 11/242,230 filed Oct. 3, 2005, titled "Low-Noise Fine-Frequency Tuning," incorporated herein by reference.

Other than achieving a rapid temperature response, it is also important that the temperature measurements supplied to controller 104 accurately reflect the temperature of the target block (i.e., the circuit and/or the circuit element or component being calibrated). Ideally, placing the temperature sensor in the center of the target block would provide the most accurate temperature reading of the target block. But, due to physical and practical limitations, the sensor can not be position as such and is instead placed in close proximity to the target block. This limitation however, presents a problem which if not addressed can lead to improper calibration of the target block. The problem and a solution, in accordance with an embodiment of the invention, are illustrated in FIGS. 5A and 5B.

Figure 5A:
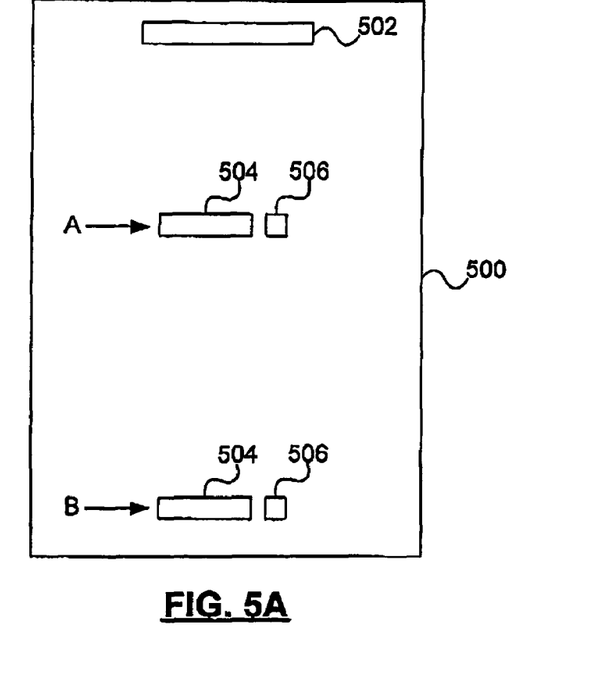
FIGS. 5A and 5B illustrate two locations of a target circuit or component and its accompanying temperature sensor relative to a heat source on a die and the temperature gradient across the die, respectively.
Figure 5B:
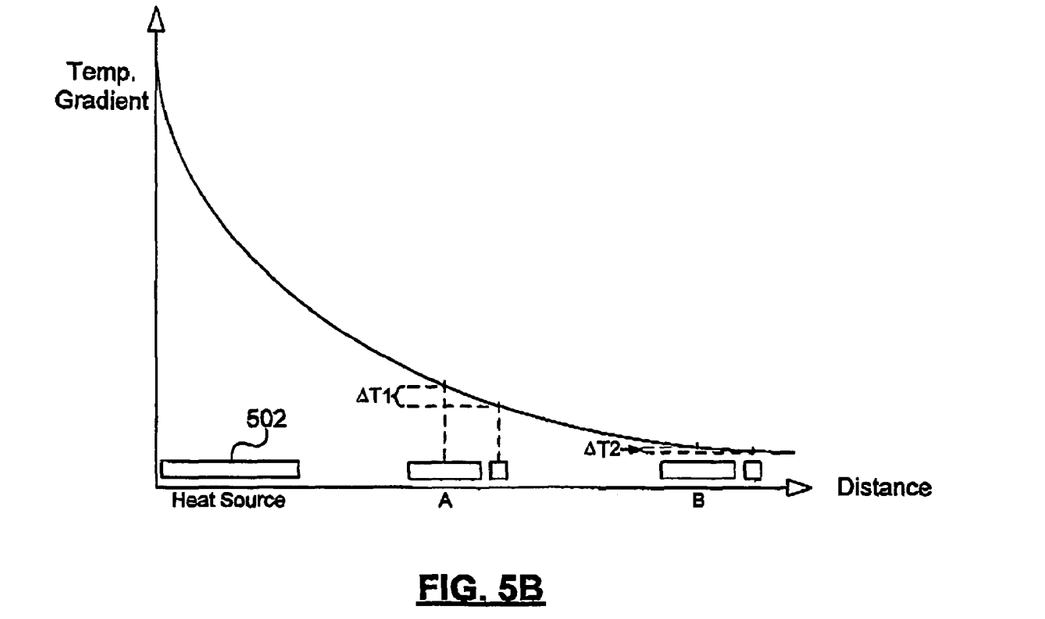

FIG. 5A illustrates two alternate locations A and B of the target block 504 and temperature sensor 506 relative to a heating circuit 502 on a die 500. FIG. 5B shows the temperature gradient (an exponential decay) across die 500, as well as the positions of the two die locations A and B and the heating source 502. As can be seen, because location A is along the steeper-sloped portion of the temperature gradient than is position B, the temperature difference ΔT2 between the sensor and the target block at position B is far less than the temperature difference ΔT1 at position A. Thus, the temperature sensor at location B more accurately reflects the temperature of the target block than does the sensor at location A.

Accordingly, by placing the heating circuit 502 as far away from the target circuit as possible, under-heating or overheating of the target circuit is substantially minimized, thus enabling accurate calibration of temperature sensitive circuits and or components on the die.

Figure 6:
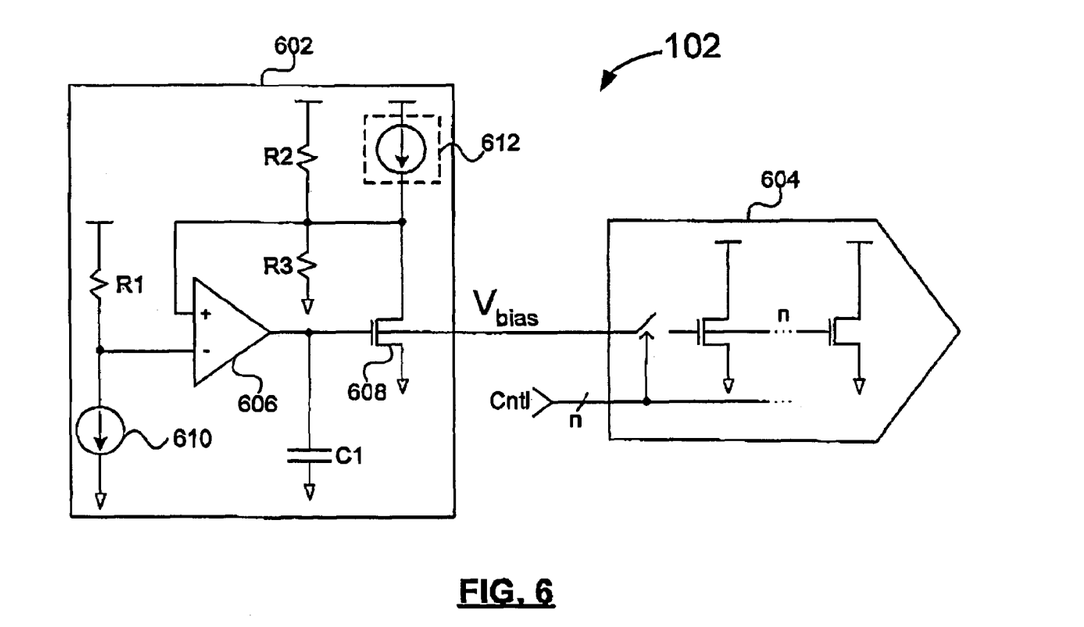
FIG. 6 shows a circuit implementation of a heating circuit in accordance with an embodiment of the invention.

Another important feature of the present invention is that the heating circuit is designed so that it is substantially insensitive to supply voltage and temperature variations. FIG. 6 shows an exemplary circuit implementation of heating circuit block 102 (FIG. 1) in accordance with an embodiment of the invention. Heating circuit 102 comprises a bias circuit 602 which generates a bias signal Vbias, and a power dissipating circuit 604 configured to generate heat under the control of Vbias and control signals Cntl provided by digital controller 104 (FIG. 1).

In the FIG. 6 exemplary implementation, control signals Cntl comprises a bit stream (n bits) corresponding to the number of transistors in the power dissipating circuit 604. Power dissipating circuit 604 comprises an array of "n" transistors coupled between the power supply Vdd and the ground terminal. The gate of each transistor is selectively coupled to Vbias under the control of control signals Cntl. Depending on the target temperature, digital controller 104 turns on a predetermined number of the transistors in the transistor array by selectively connecting the gates of the predetermined number of transistors to Vbias.

In an alternate embodiment, power dissipating circuit 604 is configured to receive a combination of binary coded and thermometer coded signals in order to guarantee monotonicity and thus negative feedback in the control loop while minimizing the complexity of power dissipating circuit 604. In this embodiment, the binary coded and thermometer coded signals are respectively provided via the most significant bit locations (MSB) and least significant bit locations (LSB) of the Cntl signals.

Bias circuit 602 serves to substantially minimize the impact of supply voltage and temperature variations on the operation of power dissipating circuit 604. Since power is determined by the product of current and voltage, to keep the power dissipated in block 604 constant over supply voltage variations, Vbias is varied inversely with respect to variations in the supply voltage. For example, if the supply voltage increases, Vbias reduces sufficiently so that the power dissipated by each conducting transistor in block 604 remains unchanged. Bias circuit 602 achieves this by performing analog compensation using a feedback circuit.

Bias circuit 602 includes an amplifier 606 with a resistor RI connected between the supply voltage and its negative input terminal, and a current source 610 connected between its negative terminal and the ground potential. The output of amplifier 606 is connected to the gate of NMOS transistor 608, and also provides the bias signal Vbias. Transistor 608 is connected between the positive terminal of amplifier 606 and the ground potential. Resistors R2 and R3 are serially connected between the supply voltage and the ground potential, with their intermediate node connected to the positive terminal of amplifier 606. A second current source 612 is connected between the supply voltage and the positive terminal of amplifier 606. A capacitor C1 is coupled to the amplifier output for purposes of compensating for amplifier feedback. A feedback circuit is thus formed which biases transistor 608 so that the net current through transistor 608 is dependent on the supply voltage.

Current source 610 is insensitive to supply voltage and temperature variations (similar to a band gap reference generator), and together with resistor RI serves to bias the negative terminal of amplifier 606 to a fixed voltage below supply voltage Vdd. Thus, the negative input of amplifier 606 tracks the supply voltage Vdd at a fixed voltage below Vdd. As the supply voltage increases or decreases, resistors R2 and R3 conduct more or less current, and the feedback forces the excess current to flow through transistor 608. Accordingly, amplifier 606 controls the gate voltage of transistor 608 to take away the excess current. In this manner, the current through transistor 608 and the voltage at its drain are set such that the product of the current and the drain voltage is approximately constant. Current source 612 is included for temperature compensation, and is designed to compensate for the temperature coefficient of resistors R2 and R3. This helps keep the operation of power dissipating circuit 604 insensitive to temperature variations. Therefore, for a give supply voltage range, such as 2.7V to 3.6V, a very close approximation to a constant power over temperature is obtained.

Figure 7A:
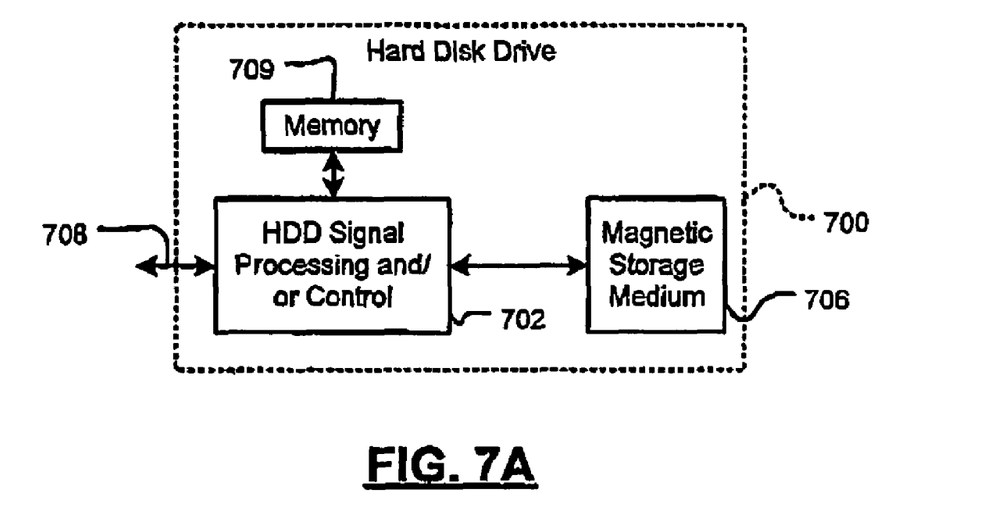
FIGS. 7A-7H illustrate various exemplary systems in which embodiments of the present invention are implemented.

Referring now to FIGS. 7A-7G, various exemplary systems in which the present invention is incorporated are shown. Referring to FIG. 7A, the present invention may be embodied in a hard disk drive 700. The present invention may be implemented in either or both signal processing and/or control circuits, which are generally identified in FIG. 7A at 702. In some implementations, signal processing and/or control circuit 702 and/or other circuits (not shown) in HDD 700 may process data, perform coding and/or encryption, perform calculations, and/or format data that is output to and/or received from a magnetic storage medium 706.

HDD 700 may communicate with a host device (not shown) such as a computer, mobile computing devices such as personal digital assistants, cellular phones, media or MP3 players and the like, and/or other devices via one or more wired or wireless communication links 708. HDD 700 may be connected to memory 709, such as random access memory (RAM), a low latency nonvolatile memory such as flash memory, read only memory (ROM) and/or other suitable electronic data storage.

Figure 7B:
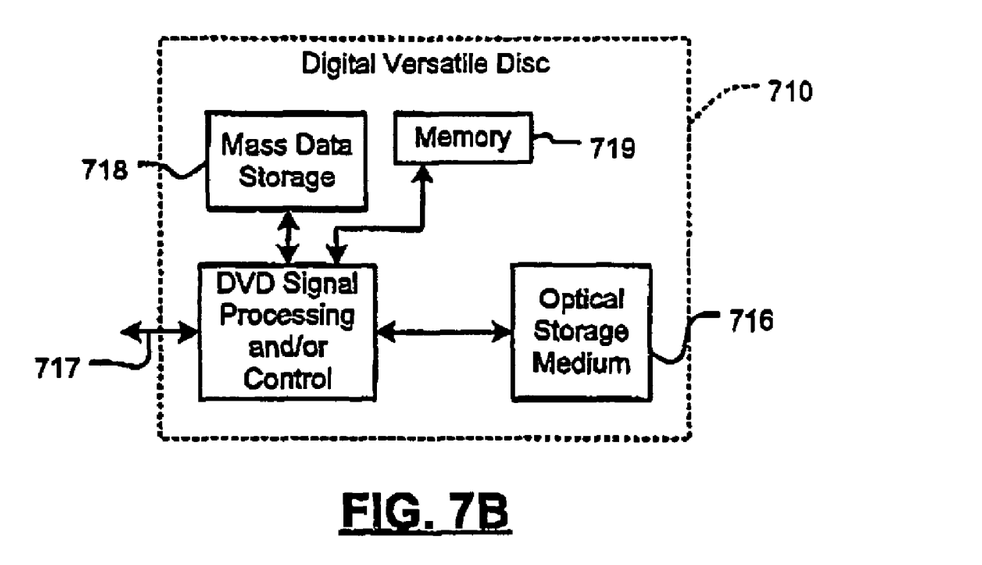

Referring now to FIG. 7B, the present invention may be embodied in a digital versatile disc (DVD) drive 710. The present invention may be implemented in either or both signal processing and/or control circuits, which are generally identified in FIG. 7B at 712, and/or mass data storage 718 of DVD drive 710. Signal processing and/or control circuit 712 and/or other circuits (not shown) in DVD 710 may process data, perform coding and/or encryption, perform calculations, and/or format data that is read from and/or data written to an optical storage medium 716. In some implementations, signal processing and/or control circuit 712 and/or other circuits (not shown) in DVD 710 can also perform other functions such as encoding and/or decoding and/or any other signal processing functions associated with a DVD drive.

DVD drive 710 may communicate with an output device (not shown) such as a computer, television or other device via one or more wired or wireless communication links 717. DVD 710 may communicate with mass data storage 718 that stores data in a nonvolatile manner. Mass data storage 718 may include a hard disk drive (HDD) such as that shown in FIG. 7A. The HDD may be a mini HDD that includes one or more platters having a diameter that is smaller than approximately 1.8". DVD 710 may be connected to memory 719, such as RAM, ROM, low latency nonvolatile memory such as flash memory, and/or other suitable electronic data storage.

Figure 7C:
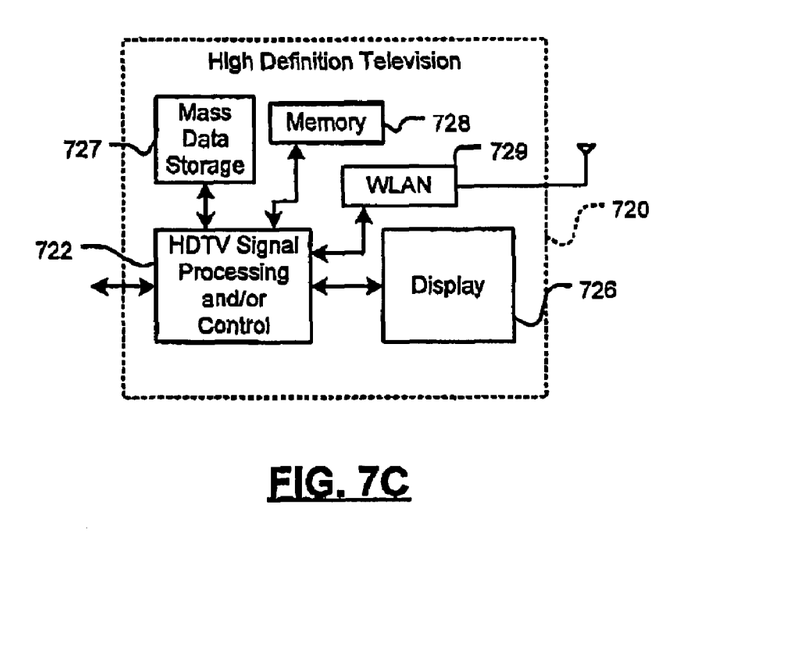

Referring now to FIG. 7C, the present invention may be embodied in a high definition television (HDTV) 720. The present invention may be implemented in either or both signal processing and/or control circuits, which are generally identified in FIG. 7C at 722, a WLAN interface and/or mass data storage of the HDTV 720. HDTV 720 receives HDTV input signals in either a wired or wireless format and generates HDTV output signals for a display 726. In some implementations, signal processing circuit and/or control circuit 722 and/or other circuits (not shown) of HDTV 720 may process data, perform coding and/or encryption, perform calculations, format data and/or perform any other type of HDTV processing that may be required.

HDTV 720 may communicate with mass data storage 727 that stores data in a nonvolatile manner such as optical and/or magnetic storage devices. At least one HDD may have the configuration shown in FIG. 7A and/or at least one DVD may have the configuration shown in FIG. 7B. The HDD may be a mini HDD that includes one or more platters having a diameter that is smaller than approximately 1.8". HDTV 720 may be connected to memory 728 such as RAM, ROM, low latency nonvolatile memory such as flash memory and/or other suitable electronic data storage. HDTV 720 also may support connections with a WLAN via a WLAN network interface 729.

Figure 7D:
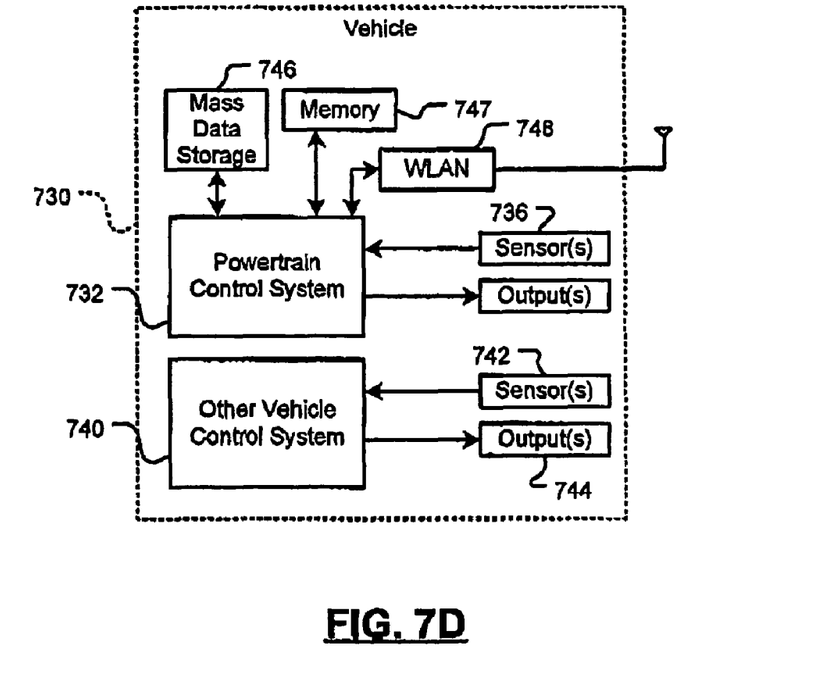

Referring now to FIG. 7D, the present invention is implemented in a control system of a vehicle 730, a WLAN interface and/or mass data storage of the vehicle control system. A powertrain control system 732 receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 740 of vehicle 730. Control system 740 may likewise receive signals from input sensors 742 and/or output control signals to one or more output devices 744. In some implementations, control system 740 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 732 may communicate with mass data storage 746 that stores data in a nonvolatile manner. Mass data storage 746 may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". Powertrain control system 732 may be connected to memory 747 such as RAM, ROM, low latency nonvolatile memory such as flash memory and/or other suitable electronic data storage. Powertrain control system 732 also may support connections with a WLAN via a WLAN network interface 748. The control system 740 may also include mass data storage, memory and/or a WLAN interface (all not shown).

Figure 7E:
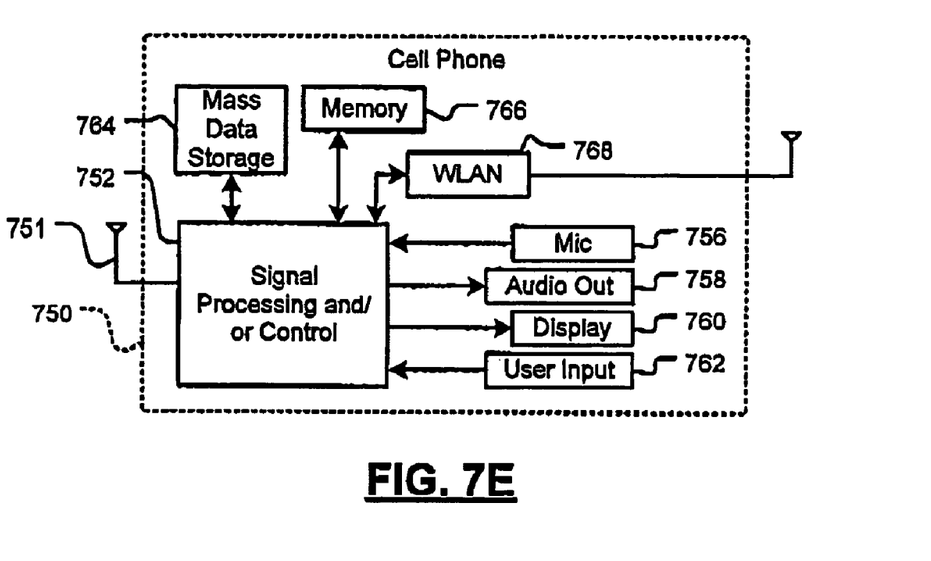

Referring now to FIG. 7E, the present invention may be embodied in a cellular phone 750 that may include a cellular antenna 751. The present invention may be implemented in either or both signal processing and/or control circuits, which are generally identified in FIG. 7E at 752, a WLAN interface and/or mass data storage of the cellular phone 750. In some implementations, cellular phone 750 includes a microphone 756, an audio output 758 such as a speaker and/or audio output jack, a display 760 and/or an input device 762 such as a keypad, pointing device, voice actuation and/or other input device. Signal processing and/or control circuits 752 and/or other circuits (not shown) in cellular phone 750 may process data, perform coding and/or encryption, perform calculations, format data and/or perform other cellular phone functions.

Cellular phone 750 may communicate with mass data storage 764 that stores data in a nonvolatile manner such as optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". Cellular phone 750 may be connected to memory 766 such as RAM, ROM, low latency nonvolatile memory such as flash memory and/or other suitable electronic data storage. Cellular phone 750 also may support connections with a WLAN via a WLAN network interface 768.

Figure 7F:
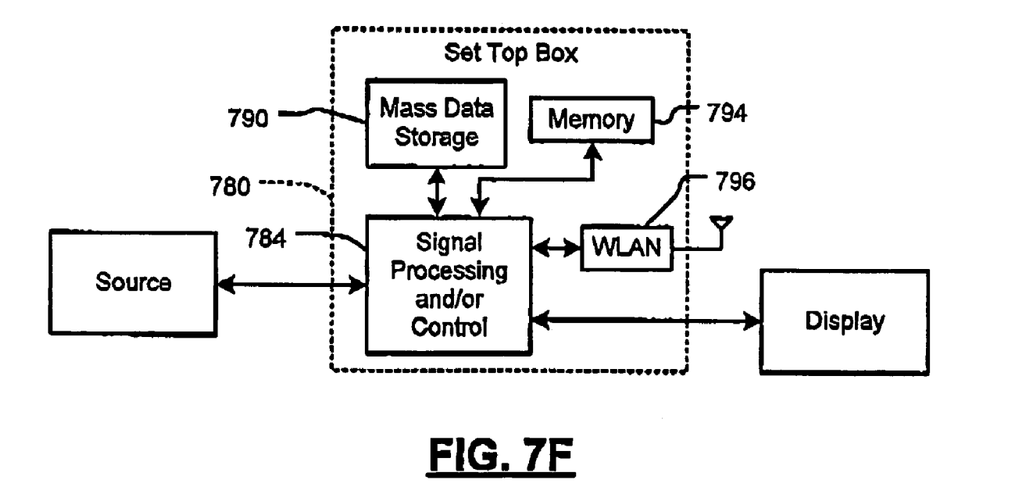

Referring now to FIG. 7F, the present invention may be embodied in a set top box 780. The present invention may be implemented in either or both signal processing and/or control circuits, which are generally identified in FIG. 7F at 784, a WLAN interface and/or mass data storage of the set top box 780. Set top box 780 receives signals from a source such as a broadband source and outputs standard and/or high definition audio/video signals suitable for a display 788 such as a television and/or monitor and/or other video and/or audio output devices. Signal processing and/or control circuits 784 and/or other circuits (not shown) of the set top box 780 may process data, perform coding and/or encryption, perform calculations, format data and/or perform any other set top box function.

Set top box 780 may communicate with mass data storage 790 that stores data in a nonvolatile manner. Mass data storage 790 may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". Set top box 780 may be connected to memory 794 such as RAM, ROM, low latency nonvolatile memory such as flash memory and/or other suitable electronic data storage. Set top box 780 also may support connections with a WLAN via a WLAN network interface 796.

Figure 7G:
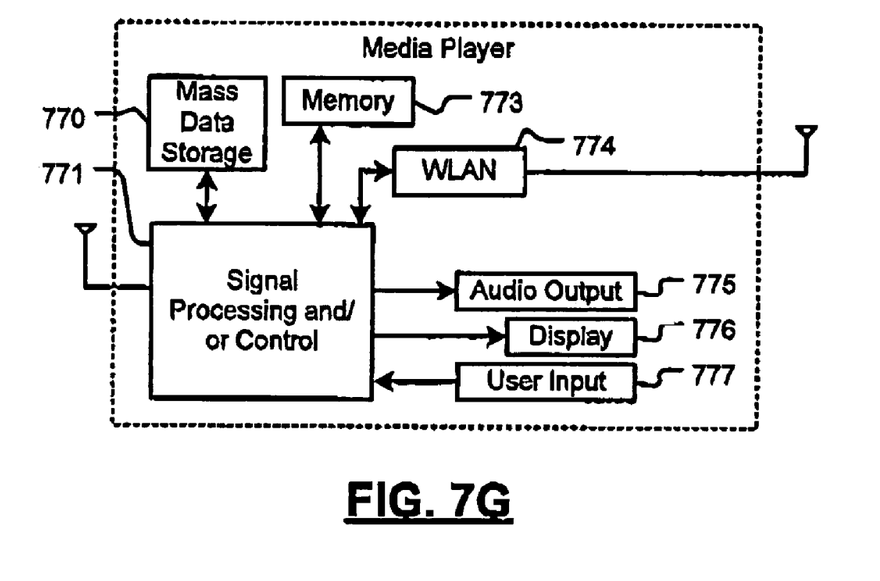

Referring now to FIG. 7G, the present invention may be embodied in a media player 772. The present invention may be implemented in either or both signal processing and/or control circuits, which are generally identified in FIG. 7G at 771, a WLAN interface and/or mass data storage of the media player 772. In some implementations, media player 772 includes a display 776 and/or a user input 777 such as a keypad, touchpad and the like. In some implementations, media player 772 may employ a graphical user interface (GUI) that typically employs menus, drop down menus, icons and/or a point-and-click interface via display 776 and/or user input 777. Media player 772 further includes an audio output 775 such as a speaker and/or audio output jack. Signal processing and/or control circuits 771 and/or other circuits (not shown) of media player 772 may process data, perform coding and/or encryption, perform calculations, format data and/or perform any other media player function.

Media player 772 may communicate with mass data storage 770 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". Media player 772 may be connected to memory 773 such as RAM, ROM, low latency nonvolatile memory such as flash memory and/or other suitable electronic data storage. Media player 772 also may support connections with a WLAN via a WLAN network interface 774.

Figure 7H:
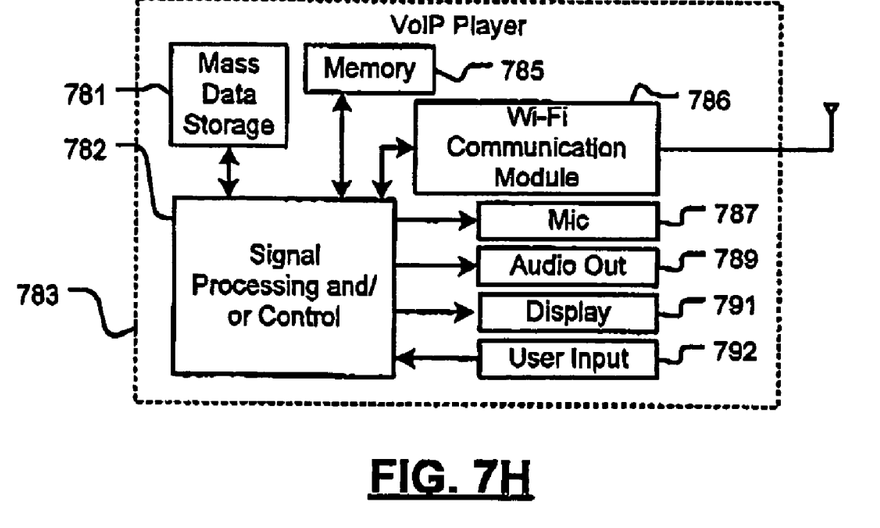

Referring to FIG. 7H, the present invention may be embodied in a Voice over Internet Protocol (VoIP) phone 783 that may include an antenna 739. The present invention may be implemented in either or both signal processing and/or control circuits, which are generally identified in FIG. 7H at 782, a wireless interface and/or mass data storage of the VoIP phone 783. In some implementations, VoIP phone 783 includes, in part, a microphone 787, an audio output 789 such as a speaker and/or audio output jack, a display monitor 791, an input device 792 such as a keypad, pointing device, voice actuation and/or other input devices, and a Wireless Fidelity (Wi-Fi) communication module 786. Signal processing and/or control circuits 782 and/or other circuits (not shown) in VoIP phone 783 may process data, perform coding and/or encryption, perform calculations, format data and/or perform other VoIP phone functions.

VoIP phone 783 may communicate with mass data storage 502 that stores data in a nonvolatile manner such as optical and/or magnetic storage devices, for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". VoIP phone 783 may be connected to memory 785, which may be a RAM, ROM, low latency nonvolatile memory such as flash memory and/or other suitable electronic data storage. VoIP phone 783 is configured to establish communications link with a VoIP network (not shown) via Wi-Fi communication module 786. Still other implementations in addition to those described above are contemplated.

The above description of exemplary embodiments of the invention has been presented for purposes of illustration and description. It is not intended to be exhaustive or to limit the invention to the precise form described, and many modifications and variations are possible in light of the teaching above. For example, while FIG. 6 shows a transistor implantation of the power dissipating circuit 604, other implementations known to one skilled in the art such as diodes, resistive metal traces, polysilicon traces, and doped substrate can also be used in implementing block 604. Thus, the embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
   a controller; and
   a heating circuit configured to heat the integrated circuit under control of the controller, the heating circuit comprising:
   a bias circuit configured to generate a bias signal; and
   a power dissipating circuit configured to receive the bias signal;

wherein:
a transfer function with adjustable pole, zero and overall gain is implemented in the controller such that a temperature response of the integrated circuit can be changed by adjusting one or more of the adjustable pole, zero and overall gain; and
at least a part of the integrated circuit is powered by a supply voltage, and in response to variation in the supply voltage the bias circuit adjusts the bias signal such that operation of the power dissipating circuit is substantially insensitive to variations of the supply voltage.

2. The integrated circuit of claim 1 wherein the controller is configured to receive a command from a source external to the integrated circuit for digitally adjusting one or more of the adjustable pole, zero and overall gain, the command including information corresponding to thermal properties of a package in which the integrated circuit is housed.

3. The integrated circuit of claim 1 wherein the zero of the adjustable pole, zero and overall gain is adjusted so as to compensate for slow thermal dynamics of the package in which the integrated circuit is housed.

4. The integrated circuit of claim 1 further comprising:
a temperature measurement circuit configured to measure a temperature of the integrated circuit; and
a detector circuit configured to detect the difference between the measured temperature and a target temperature, and provide the detected difference in temperature to the controller.

5. The integrated circuit of claim 4 further comprising a temperature sensitive block configured to be calibrated and which includes one or more circuit elements, wherein the controller is further configured to cause the heating circuit to heat the integrated circuit to multiple temperatures, the temperature sensitive block being calibrated at each of the multiple temperatures.

6. The integrated circuit of claim 4 further comprising a temperature sensitive block configured to be calibrated and which includes one or more circuit elements, wherein the temperature sensitive block and the temperature measurement circuit are located at a predetermined location on the integrated circuit where a temperature gradient generated across the integrated circuit as a result of the heat generated by the heating circuit is substantially at a minimum.

7. The integrated circuit of claim 4 further comprising a temperature sensitive block configured to be calibrated and which includes one or more circuit elements, wherein the temperature sensitive block and the temperature measurement circuit are located along a first side of the integrated circuit and the heating circuit is located along another side of the integrated circuit opposite the first side.

8. The integrated circuit of claim 1 wherein the power dissipating circuit is further configured to receive a plurality of control signals from the controller.

9. The integrated circuit of claim 1 wherein the power dissipating circuit comprises an array of transistors configured such that depending on a target temperature a predetermined number of the transistors are turned on to conduct current.

10. The integrated circuit of claim 9 wherein each transistor in the array of transistors has a gate to which the bias signal is selectively applied to turn on the transistor.

11. The integrated circuit of claim 9 wherein in response to the control signals the bias signal is selectively applied to gates of the transistors in the array of the transistors to selectively turn on the transistors.

12. The integrated circuit of claim 1 wherein the operation of the power dissipating circuit is substantially insensitive to variations of the supply voltage within a predetermined voltage range.

13. The integrated circuit of claim 1 wherein the bias circuit further operates to adjust the bias signal such that the operation of the power dissipating circuit is substantially insensitive to temperature variations.

14. A method for internally heating an integrated circuit, the method comprising:
adjusting one or more of adjustable pole, zero and overall gain of a transfer function implemented in a controller to thereby change a temperature response of the integrated circuit;
generating a bias signal for controlling the heating of the integrated circuit; and
internally heating the integrated circuit with a heating circuit included on the integrated circuit, in accordance with the adjusted one or more of adjustable pole, zero and overall gain;
wherein:
at least a part of the integrated circuit is powered by a supply voltage; and
the bias signal generating step is carried out such that an amount of heat generated as a result of the heating step is substantially insensitive to variations of the supply voltage.

15. The method of claim 14 wherein the adjusting step comprises receiving a command from a source external to the integrated circuit for digitally adjusting the one or more of the adjustable pole, zero and overall gain, the command including information corresponding to thermal properties of a package in which the integrated circuit is housed.

16. The method of claim 14 wherein the adjusting step further comprises adjusting the zero of the adjustable pole, zero and overall gain so as to compensate for slow thermal dynamics of the package in which the integrated circuit is housed.

17. The method of claim 14 further comprises:
internally measuring a temperature of the integrated circuit; and
internally detecting a difference between the measured temperature and a target temperature.

18. The method of claim 17 wherein the integrated circuit includes a temperature sensitive block configured to be calibrated and comprising one or more circuit elements, the method further comprising:
heating the integrated circuit to multiple temperatures by repeating the steps of internally heating, internally measuring, and internally detecting; and
internally calibrating the temperature sensitive block at each of the multiple temperatures.

19. The method of claim 17 wherein the internally measuring step is carried out at a location on the integrated circuit where a temperature gradient across the integrated circuit resulting from the heating step is substantially at a minimum.

20. The method of claim 17 wherein the internally measuring step is carried out at a location along a first side of the integrated circuit and the internally heating step is carried out at a location along another side of the integrated circuit opposite the first side.

21. The method of claim 14 further comprising:
depending on a target temperature, applying the bias signal to a predetermined number of transistors in an array of transistors to thereby turn on the predetermined number of transistors.

22. The method of claim 21 further comprising:
selectively applying the bias signal to a gate of each transistor in the array of transistors to turn on the transistor.

23. The method of claim 21 further comprising:
generating control signals; and
selectively applying the control signals to gates of the transistors in the array of the transistors to selectively turn on the transistors.

24. The method of claim 14 wherein the bias signal generating step is carried out such that the amount of heat generated as a result of the heating step is substantially insensitive to variations of the supply voltage within a predetermined voltage range.

25. The method of claim 24 wherein the integrated circuit includes the heating circuit receiving the bias signal and being configured to carryout the heat generating step, the bias signal generating step being carried out such that the amount of heat generated by the heating circuit is substantially insensitive to temperature variations.

* * * * *